United States Patent
Saito

(10) Patent No.: US 10,395,831 B2
(45) Date of Patent: Aug. 27, 2019

(54) ELECTRONIC COMPONENT WITH METAL TERMINALS AND ELECTRONIC COMPONENT MOUNTING CIRCUIT BOARD

(71) Applicant: TAIYO YUDEN CO., LTD., Chuo-ku, Tokyo (JP)

(72) Inventor: Naoki Saito, Takasaki (JP)

(73) Assignee: TAIYO YUDEN CO., LTD., Tokyo (JP)

(*) Notice: Subject to any disclaimer, the term of this patent is extended or adjusted under 35 U.S.C. 154(b) by 0 days.

(21) Appl. No.: 16/134,805

(22) Filed: Sep. 18, 2018

(65) Prior Publication Data

US 2019/0096582 A1    Mar. 28, 2019

(30) Foreign Application Priority Data

Sep. 26, 2017  (JP) .................. 2017-184612

(51) Int. Cl.
| | |
|---|---|
| H01G 4/248 | (2006.01) |
| H01G 4/30 | (2006.01) |
| H05K 1/18 | (2006.01) |
| H01G 4/12 | (2006.01) |
| H05K 1/11 | (2006.01) |
| H01G 4/232 | (2006.01) |

(52) U.S. Cl.
CPC .......... *H01G 4/248* (2013.01); *H01G 4/30* (2013.01); *H05K 1/181* (2013.01); *H01G 4/1218* (2013.01); *H01G 4/1227* (2013.01); *H01G 4/1236* (2013.01); *H01G 4/232* (2013.01); *H05K 1/111* (2013.01); *H05K 2201/10015* (2013.01); *H05K 2201/10628* (2013.01)

(58) Field of Classification Search
USPC ............................................. 361/308.1
See application file for complete search history.

(56) References Cited

U.S. PATENT DOCUMENTS

| | | | | |
|---|---|---|---|---|
| 3,590,348 A * | 6/1971 | Bertics | ............. | H01G 2/06 361/308.1 |
| 4,821,946 A * | 4/1989 | Abe | ............. | H05K 3/3421 228/180.21 |
| 5,812,363 A * | 9/1998 | Kuroda | ............. | H01G 4/30 361/306.3 |
| 6,181,544 B1 * | 1/2001 | Nakagawa | ............. | H01G 4/228 361/306.1 |
| 6,201,683 B1 * | 3/2001 | Yamada | ............. | H05K 3/3426 361/308.1 |

(Continued)

FOREIGN PATENT DOCUMENTS

| | | |
|---|---|---|
| JP | 2014072373 A | 4/2014 |
| JP | 2015012088 A | 1/2015 |

*Primary Examiner* — William H. Mayo, III
*Assistant Examiner* — Krystal Robinson
(74) *Attorney, Agent, or Firm* — Law Office of Katushiro Arai

(57) ABSTRACT

In an exemplary embodiment, an electronic component with metal terminals includes a multilayer ceramic capacitor 10 having a pair of external electrodes 12, and a pair of metal terminals 20 each having, integrally, a plate-like supporting part 21 and a plate-like connecting part 22, and is constituted so that the supporting part 21 of each of the metal terminals 20 is joined to each of the external electrodes 12 in a manner allowing the connecting parts 22 to face each other, wherein two projecting parts 23 are provided on the connecting face of the connecting part 22 of each of the metal terminals 20.

10 Claims, 6 Drawing Sheets

(56) References Cited

U.S. PATENT DOCUMENTS

| | | | | |
|---|---|---|---|---|
| 9,117,595 B2* | 8/2015 | Saito | | H01G 4/228 |
| 9,799,453 B2* | 10/2017 | Ahn | | H01G 4/232 |
| 2003/0118875 A1* | 6/2003 | Wu | | H01M 2/105 |
| | | | | 429/1 |
| 2003/0189817 A1* | 10/2003 | Yoshii | | H01C 1/144 |
| | | | | 361/773 |
| 2004/0259433 A1* | 12/2004 | Chiang | | H01R 13/2435 |
| | | | | 439/862 |
| 2005/0079745 A1* | 4/2005 | Ju | | H01R 4/028 |
| | | | | 439/67 |
| 2010/0123995 A1* | 5/2010 | Otsuka | | H01G 2/06 |
| | | | | 361/308.1 |
| 2010/0188798 A1* | 7/2010 | Togashi | | H01G 2/06 |
| | | | | 361/306.3 |
| 2011/0285498 A1* | 11/2011 | Yoneda | | H01C 1/014 |
| | | | | 338/306 |
| 2012/0236462 A1* | 9/2012 | Haruki | | H01G 4/005 |
| | | | | 361/306.1 |
| 2014/0063687 A1* | 3/2014 | Saito | | H01G 4/228 |
| | | | | 361/308.1 |
| 2014/0210586 A1* | 7/2014 | Atsumi | | H01F 27/292 |
| | | | | 336/192 |
| 2014/0291822 A1* | 10/2014 | Keong | | H01L 23/495 |
| | | | | 257/666 |
| 2014/0345927 A1* | 11/2014 | Itagaki | | H01G 2/065 |
| | | | | 174/260 |
| 2015/0243440 A1* | 8/2015 | Gong | | H01G 4/30 |
| | | | | 174/260 |
| 2016/0240306 A1* | 8/2016 | Kanbe | | H01F 27/292 |
| 2016/0343504 A1* | 11/2016 | Ando | | H01G 2/16 |
| 2018/0323010 A1* | 11/2018 | Park | | H05K 3/3442 |

* cited by examiner

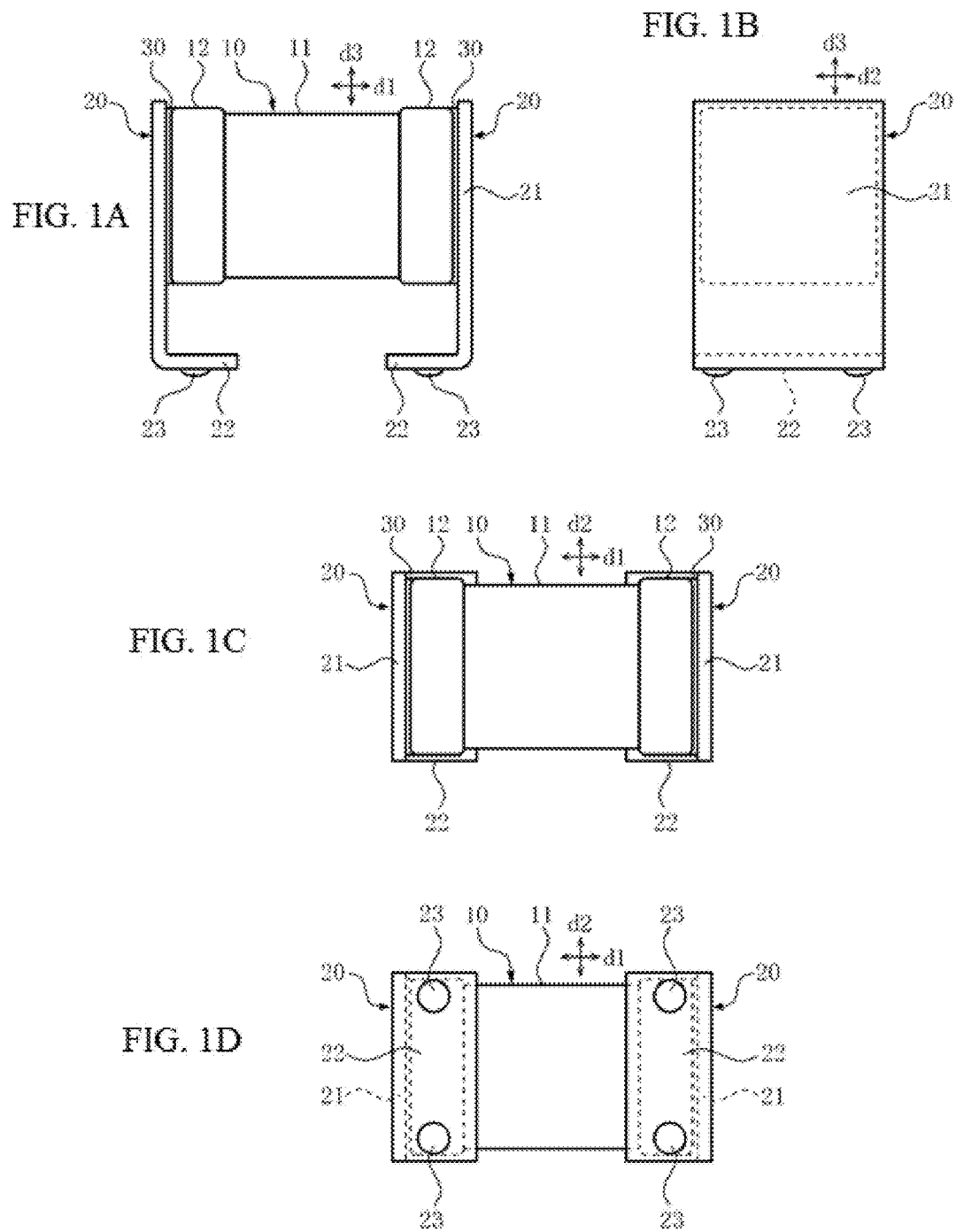

FIG. 2A
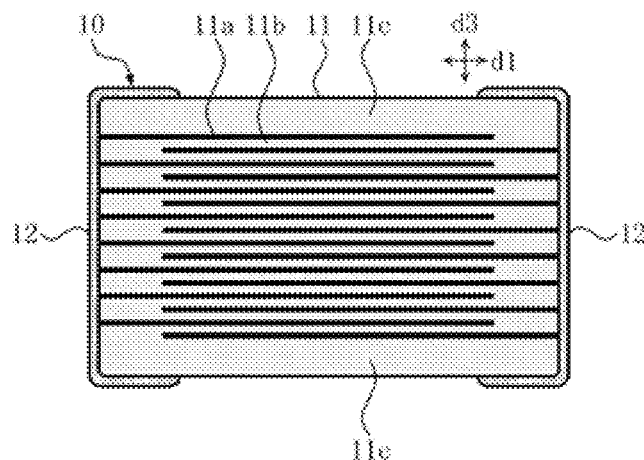
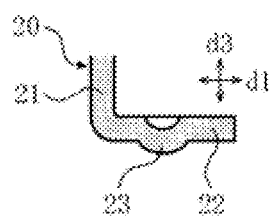  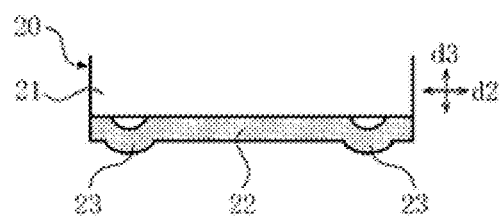
FIG. 2B      FIG. 2C
FIG. 3
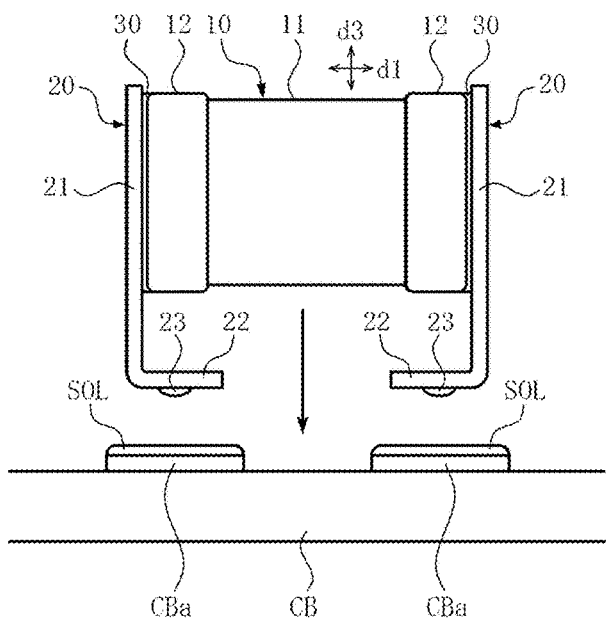

FIG. 4
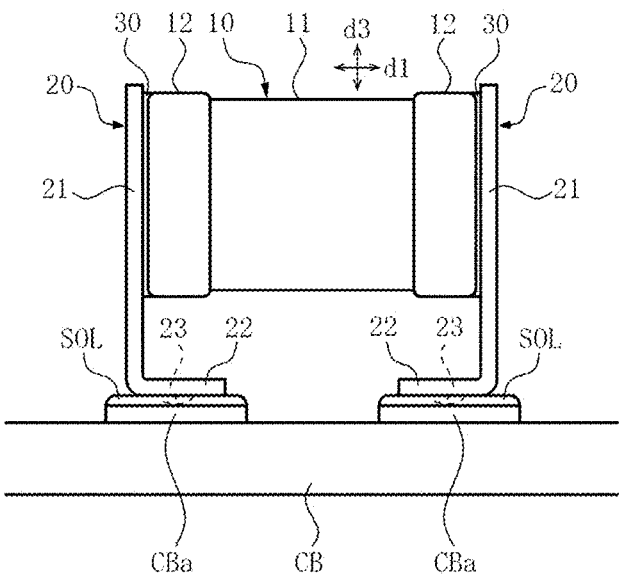
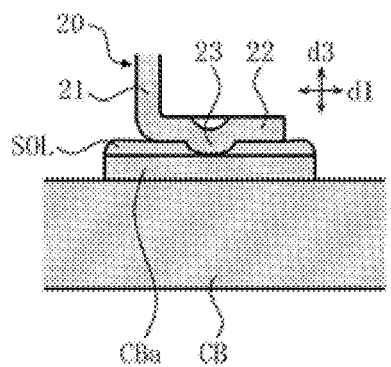
FIG. 5A
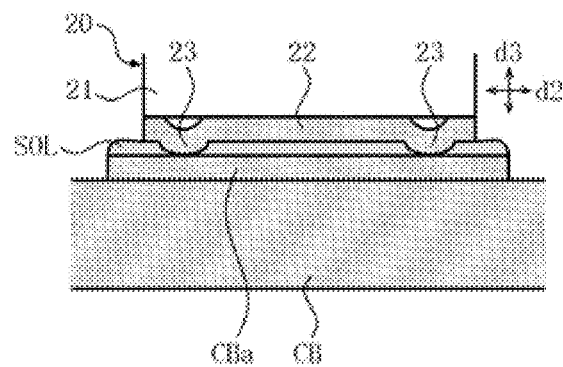
FIG. 5B
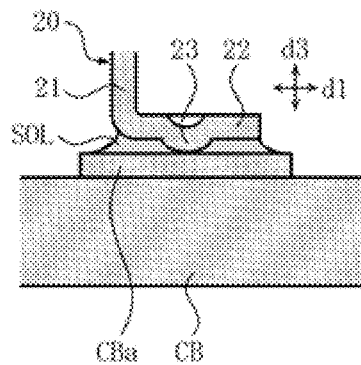
FIG. 6A
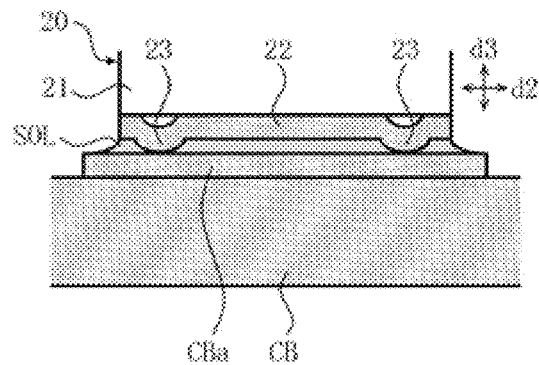
FIG. 6B

ELECTRONIC COMPONENT WITH METAL TERMINALS AND ELECTRONIC COMPONENT MOUNTING CIRCUIT BOARD

BACKGROUND

Field of the Invention

The present invention relates to an electronic component with metal terminals comprising an electronic component and a pair of metal terminals, as well as an electronic component mounting circuit board constituted by such electronic component with metal terminals mounted on a circuit board.

Description of the Related Art

An electronic component with metal terminals comprises a multilayer ceramic capacitor or other electronic component having a pair of external electrodes, and a pair of metal terminals each having, integrally, a plate-like supporting part and a plate-like connecting part, where the supporting part of each of the metal terminals is joined to each of the external electrodes of the electronic component in a manner allowing the connecting parts to face each other (refer to Patent Literatures 1 and 2 mentioned below). This electronic component with metal terminals can absorb electrostrictive elongations or contractions of the electronic component by means of elastic deformations of the supporting parts of the metal terminals, which is effective in preventing noise after such electronic component with metal terminals has been mounted on a circuit board.

Incidentally, an electronic component with metal terminals is mounted on a circuit board by connecting, using a solder, the connecting part of each of the metal terminals of the electronic component with metal terminals, to a conductor pad on the circuit board, and the reflow soldering method is generally adopted for this solder connection. For reference, under the reflow soldering method, a solder paste is applied on each of the conductor pads on the circuit board corresponding to the connecting part of each of the metal terminals of the electronic component with metal terminals, and then the connecting part of each of the metal terminals of the electronic component with metal terminals is pressed against the solder paste that has been applied on each of the conductor pads to install the electronic component with metal terminals on the circuit board, after which the circuit board on which the electronic component with metal terminals has been installed is put in a reflow oven to melt and then solidify the solder paste.

However, if the connecting parts of the metal terminals of the electronic component with metal terminals are plate-like, as described in Patent Literatures 1 and 2 mentioned below, concerns arise that the following problems may occur during the aforementioned solder connection.

The application thickness of the solder paste being applied on each of the conductor pads on the circuit board varies slightly, and the pressing depth to which each of the connecting parts of the metal terminals of the electronic component with metal terminals is pressed against the solder paste that has been applied on each of the conductor pads also varies slightly.

Since the solder paste applied on each of the conductor pads melts while in contact with the connecting part of each of the metal terminals, the molten solder primarily flows between each of the conductor pads and the connecting part of each of the metal terminals, and also to the periphery of the connecting part of each of the metal terminals. If an excess of molten solder generates due to the aforementioned variations, however, this excess portion oozes outward and a phenomenon occurs where the electronic-component-side face of the connecting part, and the electronic-component-side face and opposite face of the supporting part, of each of the metal terminals, become wet.

If such wetting phenomenon occurs, the excess molten solder solidifies while the electronic-component-side face of the connecting part, and the electronic-component-side face and opposite face of the supporting part, of each of the metal terminals, are wet, and this solidification impairs the elasticity of the supporting part of each of the metal terminals. In other words, the impaired elasticity of the supporting part of each of the metal terminals considerably reduces its ability to absorb electrostrictive elongations and contractions of the electronic component, which makes it difficult to prevent noise in a way as intended, after the electronic component with metal terminals has been mounted on the circuit board.

It should be noted that, while Patent Literature 1 mentioned below describes providing a solder attachment prevention area on the electronic-component-side face of the connecting part of each of the metal terminals to prevent the aforementioned wetting phenomenon, and Patent Literature 2 mentioned below describes providing a solder attachment prevention area on the electronic-component-side face of the supporting part of each of the metal terminals to prevent the aforementioned wetting phenomenon, they do not prevent an excess of molten solder (portion that has oozed outward) from generating as a result of the aforementioned variations.

BACKGROUND ART LITERATURE

[Patent Literature 1] Japanese Patent Laid-open No. 2014-072373

[Patent Literature 2] Japanese Patent Laid-open No. 2015-012088

SUMMARY

An object of the present invention is to provide an electronic component with metal terminals that can prevent as much as possible the wetting phenomenon, by an excess of molten solder, of the electronic-component-side face of the connecting part, and the electronic-component-side face and opposite face of the supporting part, of each of its metal terminals, when the connecting part of each of the metal terminals is connected using a solder applied to each of the conductor pads on a circuit board, as well as an electronic component mounting circuit board constituted by such electronic component with metal terminals mounted on a circuit board.

Any discussion of problems and solutions involved in the related art has been included in this disclosure solely for the purposes of providing a context for the present invention, and should not be taken as an admission that any or all of the discussion were known at the time the invention was made.

To achieve the aforementioned object, the electronic component with metal terminals pertaining to the present invention is an electronic component with metal terminals comprising an electronic component having a pair of external electrodes, and a pair of metal terminals each having, integrally, a plate-like supporting part and a plate-like connecting part, where the supporting part of each of the metal terminals is joined to each of the external electrodes of the electronic component in a manner allowing the connecting parts to face each other, wherein at least one projecting part is provided on the connecting face of the connecting part of each of the metal terminals. On the other hand, the electronic component mounting circuit board pertaining to the present invention is constituted by the aforementioned electronic component with metal terminals mounted on a circuit board.

According to the electronic component with metal terminals and electronic component mounting circuit board pertaining to the present invention, the wetting phenomenon, by an excess of molten solder, of the electronic-component-side face of the connecting part, and the electronic-component-side face and opposite face of the supporting part, of each of the metal terminals can be prevented as much as possible when the connecting part of each of the metal terminals of the electronic component with metal terminals is connected using a solder applied to each of the conductor pads on the circuit board.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIG. 1A is a front view of an electronic component with metal terminals to which the present invention is applied, FIG. 1B is a right side view of the electronic component with metal terminals shown in FIG. 1A, FIG. 1C is a plan view of the electronic component with metal terminals shown in FIG. 1A, and FIG. 1D is a bottom view of the electronic component with metal terminals shown in FIG. 1A.

FIG. 2A is an enlarged longitudinal cross-sectional view of the multilayer ceramic capacitor shown in FIGS. 1A to 1D, FIG. 2B is an enlarged longitudinal cross-sectional view of key parts of the metal terminal shown in FIGS. 1A to 1D, and FIG. 2C is an enlarged longitudinal cross-sectional view, rotated by 90 degrees from FIG. 2B, of key parts of the metal terminal shown in FIGS. 1A to 1D.

FIG. 3 is a drawing of the electronic component with metal terminals shown in FIGS. 1A to 1D, in a condition before it is installed on a circuit board.

FIG. 4 is a drawing of the electronic component with metal terminals shown in FIGS. 1A to 1D, in a condition after it has been installed on a circuit board.

FIG. 5A is an enlarged longitudinal cross-sectional view of key parts corresponding to FIG. 2B in the installed condition shown in FIG. 4, and FIG. 5B is an enlarged longitudinal cross-sectional view of key parts corresponding to FIG. 2C in the installed condition shown in FIG. 4.

FIG. 6A is an enlarged longitudinal cross-sectional view of key parts corresponding to FIG. 5A with the solder in molten state, and FIG. 6B is an enlarged longitudinal cross-sectional view of key parts corresponding to FIG. 5B with the solder in molten state.

DESCRIPTION OF THE SYMBOLS

Figure 7:
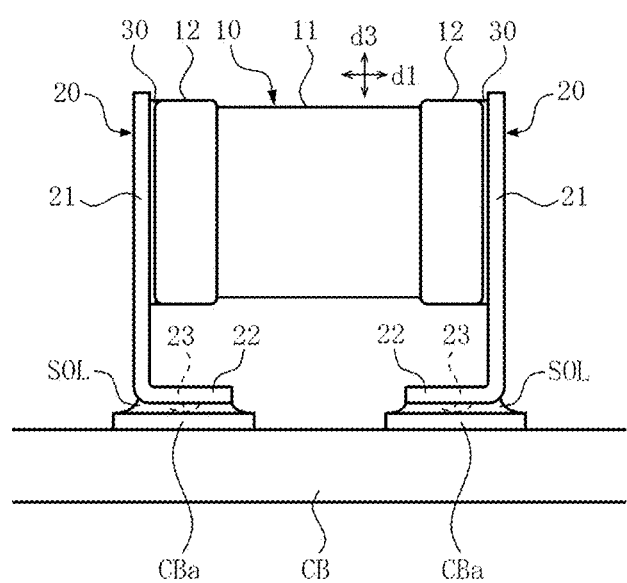
FIG. 7 is a drawing of the electronic component with metal terminals shown in FIGS. 1A to 1D, in a condition mounted on a circuit board.

10 - - - Multilayer ceramic capacitor, 11 - - - Capacitor body, 12 - - - External electrode, 20 - - - Metal terminal, 21 - - - Supporting part, 22 - - - Connecting part, 23 - - - Projecting part, 30 - - - Conductive bonding material, CB - - - Circuit board, CBa - - - Conductor pad, SOL - - - solder.

DETAILED DESCRIPTION OF EMBODIMENTS

In the explanations below, the direction in which two opposing faces of the capacitor body 11 mentioned below face each other (corresponding to the lateral direction in FIGS. 1A, 1C, and 1D and also corresponding to the direction in which the external electrodes 12 mentioned below face each other) is denoted as the "first direction d1," the direction in which other two opposing faces of the capacitor body 11 face each other (corresponding to the lateral direction in FIG. 1B and the vertical direction in FIGS. 1C and 1D) is denoted as the "second direction d2," and the direction in which the remaining two opposing faces of the capacitor body 11 face each other (corresponding to the vertical direction in FIGS. 1A and 1B and also corresponding to the direction in which the internal electrode layers 11a mentioned below are stacked) is denoted as the "third direction d3," for the sake of convenience.

Also, with respect to each constitutional element, the dimension along the first direction d1 is denoted as the "first-direction dimension D1 [symbol of constitutional element]," the dimension along the second direction d2 is denoted as the "second-direction dimension D2 [symbol of constitutional element]," and the dimension along the third direction d3 is denoted as the "third-direction dimension D3 [symbol of constitutional element]." It should be noted that the values of the respective dimensions D1 [symbol of constitutional element] to D3 [symbol of constitutional element], given as examples, are reference dimensions for the purpose of design and do not include dimensional tolerances for the purpose of manufacturing.

<<Electronic Component with Metal Terminals>>

First, FIGS. 1A to 2C are used to explain the constitution of an electronic component with metal terminals to which the present invention is applied, or specifically an electronic component with metal terminals comprising a multilayer ceramic capacitor 10 as an electronic component and a pair of metal terminals 20.

<Multilayer Ceramic Capacitor 10>

The multilayer ceramic capacitor 10 comprises: a capacitor body 11 of roughly rectangular solid shape which has a capacitive part (not accompanied by symbol) having multiple internal electrode layers 11a (total 16 layers in FIG. 2A) that are stacked together with dielectric layers 11b (total 15 layers in FIG. 2A) in between; an external electrode 12 which is provided on one end part of the capacitor body 11 in the first direction d1 and to which some (total eight layers in FIG. 2A) of the multiple internal electrode layers 11a are connected; and an external electrode 12 which is provided on the other end part of the capacitor body 11 in the first direction d1 and to which the remainder (total eight layers in FIG. 2A) of the multiple internal electrode layers 11a are connected.

FIGS. 1A to 2C were drawn based on a prototype, and for reference, the first-direction dimension D1 [11], the second-direction dimension D2 [11], and the third-direction dimension D3 [11], of the capacitor body 11 in this prototype, are 2100 μm, 1250 μm, and 1250 μm, respectively.

The internal electrode layers 11a are each rectangularly shaped, and each have roughly the same first-direction dimension D1 [11a], second-direction dimension D2 [11a] and third-direction dimension D3 [11a]. The number of dielectric layers 11b is the number of internal electrode layers 11a minus 1, and the dielectric layers 11b each have roughly the same third-direction dimension D3 [11b]. Also, the capacitive part (not accompanied by symbol) constituted by the multiple internal electrode layers 11a and multiple dielectric layers 11b are surrounded by dielectric margin parts 11c on both sides in the third direction d3 and also by dielectric margin parts 11d (not illustrated) on both sides in the second direction d2. The multiple internal electrode layers 11a are staggered alternately in the first direction d1, where the first-direction d1 ends of odd-numbered internal electrode layers 11a from the top in FIG. 2A are connected to one external electrode 12, while the first-direction d1 ends of even-numbered internal electrode layers 11a from the top in FIG. 2A are connected to the other external electrode 12.

For reference, the first-direction dimension D1 [11a], and the second-direction dimension D2 [11a], of the internal electrode layer 11a in the aforementioned prototype, are 1750 μm and 1500 μm, respectively. Also, the third-direction dimension D3 [11c] of each of the dielectric margin parts 11c on both sides in the third direction d3 is 100 μm, while the second-direction dimension D2 [11d] of each of the dielectric margin parts 11d on both sides in the second direction d2 is 100 μm.

FIG. 2A depicts a total of 16 internal electrode layers 11a and a total of 15 dielectric layers 11b for the sake of illustration; however, the number of internal electrode layers 11a and their third-direction dimension D3 [11a], and the third-direction dimension D3 [11b] of the dielectric layer 11b, including the first-direction dimension D1 [11a] and second-direction dimension D2 [11a] of each of the internal electrode layers 11a, can be changed as desired according to the target capacitance value. While affected by the target capacitance value, the third-direction dimension D3 [11a] of each of the internal electrode layers 11a is preferably in a range of 0.3 to 1.5 μm, for example, while the third-direction dimension D3 [11b] of each of the dielectric layers 11b is preferably in a range of 0.5 to 4.0 μm, for example.

To add on the material for the capacitor body 11, nickel, copper, palladium, platinum, silver, gold, or alloy thereof, etc., may be used favorably as the primary component of each of the internal electrode layers 11a. Also, a dielectric ceramic, or specifically barium titanate, strontium titanate, calcium titanate, magnesium titanate, calcium zirconate, calcium zirconate titanate, barium zirconate, titanium oxide, etc., may be used favorably as the primary component of each of the dielectric layers 11b, each of the dielectric margin parts 11c, and each of the dielectric margin parts 11d. It should be noted that the primary component of the dielectric layer 11b and the primary component of the dielectric margin part 11c can be different from each other, while the primary component of the dielectric layer 11b, the primary component of the dielectric margin part 11c on one side in the third direction d3, and the primary component of the dielectric margin 11c on the other side in the third direction d3, can be different from one another.

The external electrodes 12 each continuously have: a first planar part (not accompanied by symbol) of roughly rectangular shape which is present on an end face (left end face in FIG. 2A or right end face in FIG. 2A) of the capacitor body 11 in the first direction d1; a second planar part (not accompanied by symbol) of roughly rectangular shape which is present on one end face (bottom end face in FIG. 2A) of the capacitor body 11 in the third direction d3; a third planar part (not accompanied by symbol) of roughly rectangular shape which is present on the other end face (top end face in FIG. 2A) of the capacitor body 11 in the third direction d3; a fourth planar part (not accompanied by symbol) of roughly rectangular shape which is present on one end face (bottom end face in FIG. 1C) of the capacitor body 11 in the second direction d2; and a fifth planar part (not accompanied by symbol) of roughly rectangular shape which is present on the other end face (top end face in FIG. 1C) of the capacitor body 11 in the second direction d2. In other words, the external electrodes 12 are each a five-faced external electrode.

For reference, the first-direction dimension D1 [not accompanied by symbol] of the second planar part through fifth planar part, the first-direction dimension D1 [not accompanied by symbol] of the first planar part, the third-direction dimension D3 [not accompanied by symbol] of the second planar part and third planar part, and the second-direction dimension D2 [not accompanied by symbol] of the fourth planar part and fifth planar part, of each of the external electrodes 12 in the aforementioned prototype, are 400 μm, 20 μm, 20 μm, and 20 μm, respectively.

Although not illustrated, the external electrodes 12 each adopt a two-film constitution formed by a base metal film contacting the capacitor body 11 and a surface metal film contacting the exterior side of the base metal film, or a multi-film constitution having at least one intermediate metal film between these base metal film and surface metal film. The base metal film in a two-film constitution or multi-film constitution is constituted by a baked metal film or plated metal film, for example, and nickel, copper, palladium, platinum, silver, gold, or alloy thereof, etc., may be used favorably as the primary component of this base metal film. Also, the surface metal film is constituted by a plated metal film, for example, and copper, tin, palladium, gold, zinc, or alloy thereof, etc., may be used favorably as the primary component of this surface metal film. Further-more, the intermediate metal film is constituted by a plated metal film, for example, and platinum, palladium, gold, copper, nickel, or alloy thereof, etc., may be used favorably as the primary component of this intermediate metal film.

<Each Metal Terminal 20>

The metal terminals 20 each have, integrally, a plate-like supporting part 21 of roughly rectangular shape and a plate-like connecting part 22 of roughly rectangular shape, where the angle formed by the supporting part 21 and the connecting part 22 is roughly 90 degrees. Additionally, on the connecting face (not accompanied by symbol; bottom face in FIGS. 2B and 2C) of the connecting part 22 of each of the metal terminals 20, two projecting parts 23 which appear roughly semispherical are provided in the second direction d2 with spacing in between.

For reference, the second-direction dimension D2 [21], the third-direction dimension D3 [21], and the first-direction dimension D1 [21], of the supporting part 21, are 1350 μm, 1900 μm, and 100 μm, respectively, while the second-direction dimension D2 [22], the first-direction dimension D1 [22], and the third-direction dimension D3 [22], of the connecting part 22, are 1350 μm, 600 μm, and 100 μm (excluding the projecting part 23), respectively, with respect to each of the metal terminals 20 in the aforementioned prototype.

Also, in the aforementioned prototype, the maximum first-direction dimension D1 [23] and second-direction dimension D2 [23] (corresponding to the diameter shown in FIG. 1D), and the third-direction dimension D3 [23] (corresponding to the projecting dimension from the connecting face), of each of the projecting parts 23, are 200 μm and 40 μm, respectively, where the center spacing between the two projecting parts 23 provided on the connecting face of each of the connecting parts 22 (spacing between the centers of the two projecting parts 23 in the second direction d2) is 950 μm, the second-direction d2 spacing between the center of each of the projecting parts 23 and the second-direction d2 end of each of the connecting parts 22 is 200 μm, and the first-direction d1 spacing between the center of each of the projecting parts 23 and the first-direction d1 end of each of the connecting parts 22, is 300 μm.

To add on the material for each of the metal terminals 20, iron, nickel, chromium, copper, aluminum, palladium, platinum, silver, gold, or alloy thereof, etc., may be used favorably as the primary component of each of the metal terminals 20. Needless to say, each of the metal terminals 20 may have one or more plated or clad surface layers made of nickel, copper, gold, tin, or alloy thereof, etc., to add affinity with the molten solder mentioned below. As for the method for producing each of the metal terminals 20, each of the metal terminals 20 may be produced by preparing a desired metal plate, stamping the metal plate by press-forming, and then bending a part of the stamped metal plate by roughly 90 degrees. The two projecting parts 23 on the connecting part 22 of each of the metal terminals 20 may be produced by press-forming using dies. In other words, the press-formability of the aforementioned stamping, and of the aforementioned projecting parts, prevents the unit price of the metal terminal 20, and the unit price of the electronic component with metal terminals, from rising due to the forming of the projecting parts.

<Joining of Multilayer Ceramic Capacitor 10 and Each Metal Terminal 20>

The electronic component with metal terminals shown in FIGS. 1A to 1D is constituted by joining the supporting part 21 of each of the aforementioned metal terminals 20 to the first-direction d1 end face (left end face in FIG. 2A or right end face in FIG. 2A) of each of the external electrodes 12 of the aforementioned multilayer ceramic capacitor 10, using a conductive bonding material 30, in a manner allowing the connecting parts 22 to face each other in the first direction d1.

As the material for this conductive bonding material 30, a solder containing at least two metal elements selected from tin, copper, silver, nickel, germanium, gold, antimony, bismuth, zinc, gallium, and indium, or a synthetic resin adhesive, etc., in which silver grains, gold grains, etc., have been dispersed to add conductivity, may be used favorably.

As is evident from FIGS. 1A to 1D, the metal terminals 20 that are each joined to each of the external electrodes 12 of the multilayer ceramic capacitor 10 are placed symmetrically with their supporting parts 21 directly facing each other in the first direction d1 via the multilayer ceramic capacitor 10 in between, and with the ends of their connecting parts 22 directly facing each other in the first direction d1.

This means that the electronic component with metal terminals shown in FIGS. 1A to 1D can support itself on the total of four projecting parts 23 provided on the connecting faces of the connecting parts 22 of the metal terminals 20. In other words, the electronic component with metal terminals shown in FIGS. 1A to 1D can be self-supporting on a flat surface when placed in such a way that the total of four projecting parts 23 provided on the connecting faces of the connecting parts 22 of the metal terminals 20 contact the flat surface. The term "self-supporting" refers to staying up or upright without being supported by something else.

<<Operations and Effects Achieved by Electronic Component with Metal Terminals>>

Next, FIGS. 3 to 7 are used to explain the method for mounting the electronic component with metal terminals shown in FIGS. 1A to 1D on a circuit board CB, by including the operations and effects in the explanations.

When mounting the electronic component with metal terminals shown in FIGS. 1A to 1D on the circuit board CB according to the reflow soldering method, a solder paste SOL is applied, by means of printing, etc., on each of the conductor pads CBa on the circuit board CB corresponding to the connecting part 22 of each of the metal terminals 20 of the electronic component with metal terminals, as shown in FIG. 3. It should be noted that the external shape of each of the conductor pads CBa on the circuit board CB depicted in FIG. 3 is slightly larger than the external shape of the connecting part 22 of each of the metal terminals 20. For example, if each of the connecting parts 22 has a second-direction dimension D2 [22] of 1350 μm and a first-direction dimension D1 [22] of 600 μm, then the each of the conductor pads CBa is depicted as having a second-direction dimension D2 [CBa] of 1550 μm and a first-direction dimension D1 [CBa] of 800 μm.

For the aforementioned solder paste SOL, preferably a solder paste whose melting point is lower than that of the conductive bonding material 30 used in each area of the electronic component with metal terminals, is used. If a conductive bonding material 30 whose melting point is roughly 250° C. is used in each area, for example, it is better to use a solder paste SOL whose melting point is roughly 220° C. Also, preferably the application thickness of the solder paste SOL being applied on each of the conductor pads CBa, is adjusted to correspond to the third-direction dimension D3 [23] (projecting dimension from the connecting face) of the projecting part 23 provided on the connecting part 22 of each of the metal terminals 20. For example, if the third-direction dimension D3 [23] (projecting dimension from the connecting face) of each of the projecting parts 23 is 40 μm, then it is better to keep the application thickness of the solder paste SOL being applied on each of the conductor pads CBa, within a range of 30 to 50 μm. Needless to say, the application thickness of the solder paste SOL being applied on each of the conductor pads CBa may be equal to or smaller than the third-direction dimension D3 [23] (projecting dimension from the connecting face) of the projecting part 23 provided on the connecting part 22 of each of the metal terminals 20. For example, the application thickness of the solder paste SOL being applied on each of the conductor pads CBa may be 40 μm or smaller when the third-direction dimension D3 [23] (projecting dimension from the connecting face) of each of the projecting parts 23 is 40 μm.

Next, as shown in FIG. 4, the connecting part 22 of each of the metal terminals 20 of the electronic component with metal terminals is pressed against the solder paste SOL that has been applied on each of the conductor pads CBa, to install the electronic component with metal terminals on the circuit board CB.

Preferably the aforementioned pressing is performed so that the projecting part 23 provided on each of the connecting parts 22 is in contact with each of the conductor pads CBa. This allows for roughly equalizing the pressing depth to which the connecting part 22 of each of the metal terminals 20 is pressed against the solder paste SOL that has been applied on each of the conductor pads CBa. It should be noted that, when the application thickness of the solder paste SOL that has been applied on each of the conductor pads CBa is roughly the same as or slightly greater than the third-direction dimension D3 [23] (projecting dimension from the connecting face) of each of the projecting parts 23, the outer periphery part of the solder paste SOL that has been applied on each of the conductor pads CBa rises slightly, as shown in FIGS. 5A and 5B; however, the amount of this rise is regulated by the projecting part 23 that contacts the conductor pad CBa.

Next, the circuit board CB on which the electronic component with metal terminals has been installed, is put in a reflow oven not illustrated herein, to melt and then solidify the solder paste SOL.

While the solder paste SOL that has been applied on each of the conductor pads CBa melts while in contact with the connecting part 22 of each of the metal terminals 20, the projecting part 23 provided on each of the connecting parts 22 is contacting each of the conductor pads CBa, and therefore, as shown in FIGS. 6A and 6B, the molten solder SOL primarily flows to between each of the conductor pads CBa and the connecting part 22 of each of the metal terminals 20, and also to the periphery of the connecting part 22 of each of the metal terminals 20.

To be specific, a space specified by the projecting dimension of the projecting part 23 is formed between each of the conductor pads CBa and the connecting part 22 of each of the metal terminals 20, and therefore, as shown in FIGS. 6A and 6B, most of the molten solder SOL flows into this space. In other words, the molten solder SOL hardly generates any excess, and even if an excess generates, it is a small quantity; as a result, a phenomenon where this excess portion wets the multilayer-ceramic-capacitor-10-side face of the connecting part 22, and the multilayer-ceramic-capacitor-10-side face and opposite face of the supporting part 21, of each of its metal terminals 20, can be prevented as much as possible.

In other words, the solidification of any excess of the molten solder SOL while it is wetting the multilayer-ceramic-capacitor-10-side face of the connecting part 22, and the multilayer-ceramic-capacitor-10-side face and opposite face of the supporting part 21, of each of its metal terminals 20, can be prevented as much as possible, and therefore any impairment of the elasticity of the supporting part 21 of each of the metal terminals 20 due to this solidification, and any consequent reduction in its ability to absorb electrostrictive elongations and contractions of the multilayer ceramic capacitor 10, can be prevented without fail, and as a result, noise can be prevented in a way as intended after the electronic component with metal terminals has been mounted on the circuit board CB.

<<Variation Examples of Projecting Parts 23 of Metal Terminals 20>>

Next, FIGS. 8A to 9B are used to explain variation examples of projecting parts 23 provided on the connecting parts 22 of the metal terminals 20. It should be noted that operations and effects similar to those described above, with respect to the wetting by an excess solder SOL, etc., can also be achieved by the following variation examples.

<First Variation Example of Projecting Parts 23>

Figure 8A:
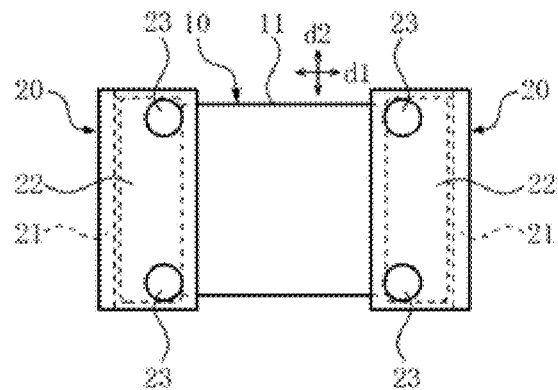
FIG. 8A is a drawing corresponding to FIG. 1D that shows a first variation example of the projecting parts provided on the connecting parts of the metal terminals shown in FIGS. 1A to 1D.

In the first variation example shown in FIG. 8A, the positions of the two projecting parts 23 provided on the connecting parts 22 of the respective metal terminals 20 are shifted so that they become closer to one another. To be specific, the first-direction d1 spacing between the center of the two projecting parts 23 provided on the connecting part 22 of one metal terminal 20, and the center of the two projecting parts 23 provided on the connecting part 22 of the other metal terminal 20, is smaller than the corresponding spacing shown in FIG. 1D. Although not illustrated, the positions of the two projecting parts 23 provided on the connecting parts 22 of the respective metal terminals 20 may be shifted so that they become farther away from one another, which is the opposite of FIG. 8A.

<Second Variation Example of Projecting Parts 23>

Figure 8B:
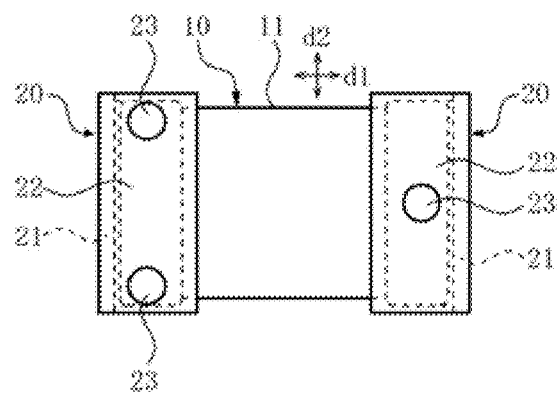
FIG. 8B is a drawing corresponding to FIG. 1D that shows a second variation example of the projecting parts provided on the connecting parts of the metal terminals shown in FIGS. 1A to 1D.

In the second variation example shown in FIG. 8B, one projecting part 23 is provided on the connecting part 22 of one metal terminal 20. In this second variation example, too, the electronic component with metal terminals can be self-supporting on one projecting part 23 provided on the connecting part 22 of one metal terminal 20 and two projecting parts 23 provided on the connecting part 22 of the other metal terminal 20, that is, on total three projecting parts 23.

<Third Variation Example of Projecting Parts 23>

Figure 8C:
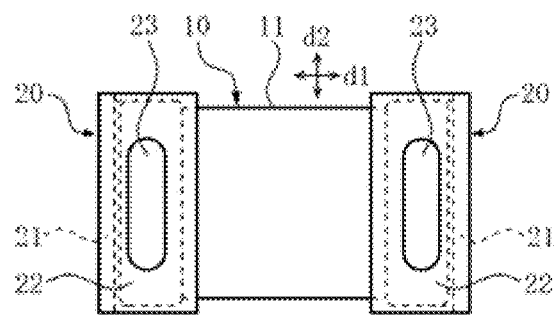
FIG. 8C is a drawing corresponding to FIG. 1D that shows a third variation example of the projecting parts provided on the connecting parts of the metal terminals shown in FIGS. 1A to 1D.

In the third variation example shown in FIG. 8C, one projecting part 23 is provided on the connecting part 22 of each of the metal terminals 20, and the shape of this projecting part 23 is elongated in the second direction d2. In this third variation example, too, the electronic component with metal terminals can be self-supporting on one projecting part 23 provided on the connecting part 22 of one metal terminal 20 and one projecting parts 23 provided on the connecting part 22 of the other metal terminal 20, that is, on total two projecting parts 23.

<Fourth and Fifth Variation Examples of Projecting Parts 23>

Figure 9A:
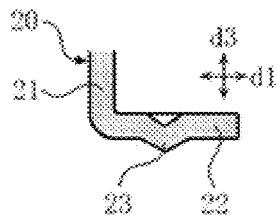
FIG. 9A is a drawing corresponding to FIG. 2B that shows a fourth variation example of the projecting part provided on the connecting part of the metal terminal shown in FIGS. 1A to 1D.
Figure 9B:
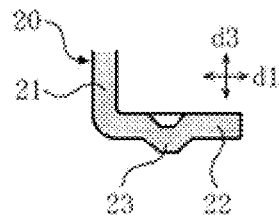
FIG. 9B is a drawing corresponding to FIG. 2B that shows a fifth variation example of the projecting part provided on the connecting part of the metal terminal shown in FIGS. 1A to 1D.

In the fourth variation example shown in FIG. 9A, the appearance of the projecting part 23 provided on the connecting part 22 of each of the metal terminals 20 is roughly conical; whereas, in the fifth variation example shown in FIG. 9B, the appearance of the projecting part 23 provided on the connecting part 22 of each of the metal terminals 20 is roughly frusto-conical. It should be noted that, if the projecting part 23 has the external shape shown in FIG. 8C, then the longitudinal cross-section of the projecting part 23 should have a roughly triangular or roughly trapezoidal shape.

<<Variation Examples of Supporting Parts 21 of Metal Terminals 20>>

Figure 10A:
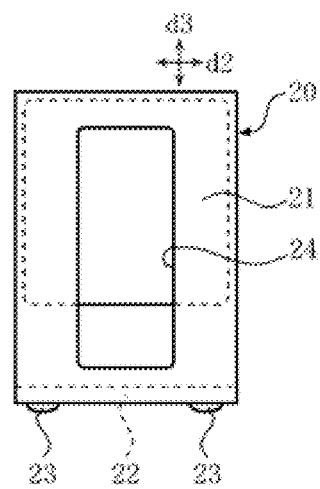
FIG. 10A is a drawing corresponding to FIG. 1B that shows a first variation example of the supporting part of the metal terminal shown in FIGS. 1A to 1D.
Figure 10B:
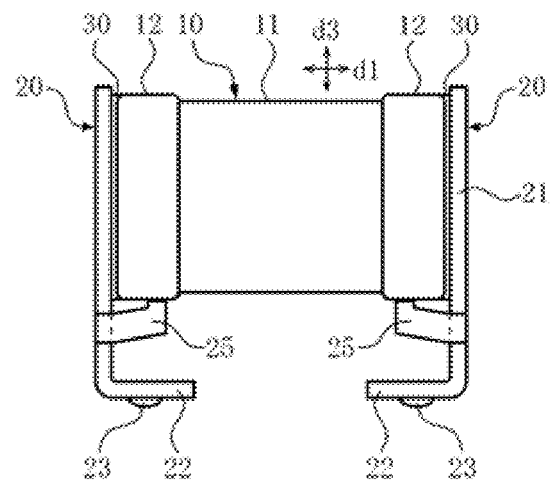
FIG. 10B is a drawing corresponding to FIG. 1A that shows a second variation example of the supporting parts of the metal terminals shown in FIGS. 1A to 1D.

Next, FIGS. 10A and 10B are used to explain variation examples of the supporting parts 21 of the metal terminals 20 shown in FIGS. 1A to 1D. It should be noted that operations and effects similar to those described above, with respect to the wetting by an excess of solder SOL, etc., can also be achieved by the following variation examples.

<First Variation Example of Supporting Parts 21>

In the first variation example shown in FIG. 10A, a through hole 24 of roughly rectangular shape is provided in the supporting part 21 of each of the metal terminals 20. This through hole 24 functions to lower the elasticity of the supporting part 21 and thereby increase its ability to absorb electrostrictive elongations and contractions of the multilayer ceramic capacitor 10, and it also achieves an operation to allow the multilayer ceramic capacitor 10 to release heat by way of the through hole 24.

<Second Variation Example of Supporting Parts 21>

In the second variation example shown in FIG. 10B, a roughly L-shaped auxiliary supporting part 25 is integrally formed on both sides, in the second direction d2, of the supporting part 21 of each of the metal terminals 20, and each of the auxiliary supporting parts 25 is bent toward the multilayer ceramic capacitor 10, so that each of the external electrodes 12 of the multilayer ceramic capacitor 10 is directly supported by the end part of each of the auxiliary supporting parts 25. Each of these auxiliary supporting parts 25 functions to prevent the multilayer ceramic capacitor 10 from sliding toward the connecting parts 22, even when the conductive bonding material 30 softens during the aforementioned reflow soldering. It should be noted that these auxiliary supporting parts 25 may be such that the capacitor body 11 of the multilayer ceramic capacitor 10 is directly supported by the end part of each of the auxiliary supporting parts 25.

<<Other Variation Examples Pertaining to Electronic Component with Metal Terminals>>

Next, other variation examples pertaining to the aforementioned electronic component with metal terminals are explained. It should be noted that operations and effects similar to those described above, with respect to the wetting by an excess solder SOL, etc., can also be achieved by the following variation examples.

<First of Other Variation Examples>

FIGS. 1A to 1D illustrate, in each view, a multilayer ceramic capacitor 10 having five-faced external electrodes 12; however, the external electrodes 12 need not be of the five-faced type because their role is to join the supporting parts 21 of the metal terminals 20, respectively. In other words, the external electrodes 12 can still join the supporting parts 21 of the metal terminals 20, respectively, when they are each changed to the one-faced type constituted by a first planar part of roughly rectangular shape which is present on an end face (left end face in FIG. 2A or right end face in FIG. 2A) of the capacitor body 11 in the first direction d1.

<Second of Other Variation Examples>

FIGS. 1A to 8A illustrate two projecting parts 23 provided on the connecting face of the connecting part 22 of each of the metal terminals 20, while FIG. 8B illustrates two projecting parts 23 provided on the connecting part 22 of one of the metal terminals 20 while one projection part 23 is provided on the connecting part 22 of the other metal terminal 20; if the connecting face of each connecting part 22 has a large area, however, three or more projecting parts 23 may be provided on each such connection face. Still, increasing the number of projecting parts 23 too much reduces the spatial volume between the conductor pad CBa and the connecting part 22 of the metal terminal 20 (refer to FIGS. 6A and 6B); if the number of projecting parts 23 is three or more, therefore, it is desirable to select an appropriate number to minimize the oozing out of excess molten solder SOL in the condition shown in FIGS. 6A and 6B.

<Third of Other Variation Examples>

FIGS. 1A to 1D and 8A illustrate two projecting parts 23 provided on the connecting face of the connecting part 22 of each of the metal terminals 20, while FIG. 8B illustrates one projecting part 23 provided on the connecting part 22 of one metal terminal 20 and two projecting parts 23 provided on the connecting part 22 of the other metal terminal 20; however, the diameter of each projecting part as shown in FIG. 1D may be enlarged or reduced according to the area of the connecting face of each connecting part 22. Still, enlarging the diameter of the projecting part 23 when the area of the connecting face of each connecting part 22 is small decreases the spatial volume between the conductor pad CBa and the connecting part 22 of the metal terminal 20 (refer to FIGS. 6A and 6B); if the diameter of the projecting part 23 is to be enlarged, therefore, it is desirable to select an appropriate diameter to minimize the oozing out of excess molten solder SOL in the condition shown in FIG. 6.

<Fourth of Other Variation Examples>

FIGS. 1A to 1D, 8A to 8C, 9A and 9B, 10A, and 10B illustrate projecting parts 23 that have been press-formed, using dies, on the connecting part 22 of each of the metal terminals 20; however, a projecting part having an identical appearance to each projecting part 23 may be added afterward to the connecting face of the connecting part 22, to produce a projecting part similar to the projecting part 23 on this connecting part 22.

<Fifth of Other Variation Examples>

FIGS. 1A to 1D and 8A to 8C illustrate a multilayer ceramic capacitor 10 whose external electrodes 12 are each joined to the supporting part 21 of each metal terminal 20 in a manner allowing the ends of the connecting parts 22 to directly face each other in the first direction d1; however, the supporting part 21 of each metal terminal 20 may be joined in a manner allowing the bases of the connecting parts 22 to directly face each other in the first direction d1, or specifically, with each of the connecting parts 22 oriented outward, not inward as shown in FIG. 1A. The metal terminals 20 shown in FIGS. 10A and 10B can also be joined in the same orientation, in which case the mode should be changed to position each auxiliary supporting part 25 below the multilayer ceramic capacitor 10. In other words, each metal terminal 20 should be such that the supporting part 21 of the metal terminal 20 is joined to each of the external electrodes 12 of the multilayer ceramic capacitor 10 in a manner allowing the connecting parts 22 to face each other.

<Sixth of Other Variation Examples>

FIGS. 1A to 1D illustrate an electronic component with metal terminals where the electronic component is a multilayer ceramic capacitor 10; however, an electronic component with metal terminals may be constituted using other electronic components that undergo similar electrostrictive elongations and contractions, such as a multilayer varistor, multilayer inductor, etc., instead of a multilayer ceramic capacitor 10.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2017-184612, filed Sep. 26, 2017, the disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

I claim:

1. An electronic component with metal terminals, comprising:
   an electronic component having a pair of external electrodes, and
   a pair of metal terminals each having, integrally, a plate-like supporting part for supporting the electronic component, and a plate-like connecting part made to be connected to a circuit board, where the supporting parts of the metal terminals are joined to the external electrodes of the electronic component, respectively, in a manner that ends of the connecting parts face each other,
   wherein the connecting part of each metal terminal has a planar connecting face facing away from the electronic component and configured to face a conductor pad of the circuit board, wherein at least one projecting part is provided on the connecting face and projects from the connecting face away from the electronic component in a manner forming a space between the conductor pad and the connecting face, into which space molten solder flows when the connecting face is connected to the conductor pad.

2. The electronic component with metal terminals according to claim 1, wherein a number of the projecting parts provided on the connecting face of the connecting part of each of the metal terminals is more than one.

3. The electronic component with metal terminals according to claim 1, wherein a number of the projecting parts provided on the connecting face of the connecting part of one of the metal terminals is more than one, and a number of the projecting parts provided on the connecting face of the connecting part of one of the metal terminals is one.

4. The electronic component with metal terminals according to claim 1, wherein said electronic component with metal terminals is capable of being self-supporting on the projecting parts provided on the connecting face of the connecting part of each of the metal terminals when the projecting parts contact on a flat surface.

5. The electronic component with metal terminals according to claim 1, wherein the connecting part of each of the metal terminals of said electronic component with metal terminals is adapted to be connected to a conductor pad on a circuit board by soldering, and a projecting dimension of the projecting part provided on the connecting face of the connecting part of each of the metal terminals is set according to an application thickness of a solder paste applied on the conductor pad.

6. The electronic component with metal terminals according to claim 5, wherein the projecting dimension of the projecting part is equal to or smaller than the application thickness of the solder paste applied on the conductor pad.

7. The electronic component with metal terminals according to claim 1, wherein the electronic component is a multilayer ceramic capacitor.

8. An electronic component mounting circuit board constituted by the electronic component with metal terminals according to claim 1, mounted on a circuit board.

9. The electronic component with metal terminals according to claim 1, wherein each projecting part is downwardly convex when a direction from the connecting face to the conductor pad is downward.

10. The electronic component with metal terminals according to claim 9, wherein each projecting part has a roughly semispherical shape, roughly conical shape, or roughly frusto-conical shape.

* * * * *